(12) United States Patent
Weng et al.

(10) Patent No.: US 7,372,497 B2
(45) Date of Patent: May 13, 2008

(54) EFFECTIVE METHOD TO IMPROVE SUB-MICRON COLOR FILTER SENSITIVITY

(75) Inventors: Fu-Tien Weng, Chu-Bei (TW);
Yu-Kung Hsiao, Yangmei (TW);
Chin-Kung Chang, Hsin-Chu (TW);
Hung-Jen Hsu, Taoyuan (TW);
Yi-Ming Dai, Hsin-Chu (TW);
Chin-Chen Kuo, Taipei (TW)

(73) Assignee: Taiwan Semiconductor Manufacturing Company (TW)

( * ) Notice: Subject to any disclaimer, the term of this patent is extended or adjusted under 35 U.S.C. 154(b) by 770 days.

(21) Appl. No.: 10/833,565

(22) Filed: Apr. 28, 2004

(65) Prior Publication Data

US 2005/0242271 A1 Nov. 3, 2005

(51) Int. Cl.
*H04N 5/225* (2006.01)
(52) U.S. Cl. ...................................... 348/340
(58) Field of Classification Search ................ 348/360, 348/302, 340; 250/214.4, 208.1, 226; 257/432, 257/225; 438/74
See application file for complete search history.

(56) References Cited

U.S. PATENT DOCUMENTS

| | | | |
|---|---|---|---|
| 4,553,153 A | 11/1985 | McColgin et al. | |
| 5,451,766 A | 9/1995 | Van Berkel | |
| 5,463,216 A | 10/1995 | Van Berkel | |
| 5,514,888 A | 5/1996 | Sano et al. | |
| 5,672,519 A | 9/1997 | Song et al. | |
| 5,796,154 A * | 8/1998 | Sano et al. | 257/432 |
| 5,844,289 A * | 12/1998 | Teranishi et al. | 257/432 |
| 5,871,653 A | 2/1999 | Ling | |
| 6,001,540 A | 12/1999 | Huang et al. | |
| 6,040,591 A | 3/2000 | Otsuka | |
| 6,046,466 A * | 4/2000 | Ishida et al. | 257/258 |
| 6,127,668 A | 10/2000 | Baek | |
| 6,133,687 A * | 10/2000 | Clarke | 313/478 |
| 6,133,954 A | 10/2000 | Jie et al. | |
| 6,171,885 B1 * | 1/2001 | Fan et al. | 438/70 |
| 6,188,094 B1 * | 2/2001 | Kochi et al. | 257/232 |
| 6,271,103 B1 * | 8/2001 | Lee | 438/464 |
| 6,274,917 B1 * | 8/2001 | Fan et al. | 257/432 |
| 6,395,576 B1 | 5/2002 | Chang et al. | |
| 6,407,415 B2 * | 6/2002 | Lee | 257/215 |
| 6,482,669 B1 | 11/2002 | Fan et al. | |
| 6,495,813 B1 * | 12/2002 | Fan et al. | 250/208.1 |
| 6,531,266 B1 * | 3/2003 | Chang et al. | 430/321 |
| 6,577,342 B1 | 6/2003 | Wester | |

(Continued)

*Primary Examiner*—Tuan Ho
*Assistant Examiner*—Amy Hsu
(74) *Attorney, Agent, or Firm*—Duane Morris, LLP (57) ABSTRACT

An image sensor device and method for forming said device are described. The image sensor structure comprises a substrate with photodiodes, an interconnect structure formed on the substrate, a color filter layer above the interconnect structure, a first microlens array, an overcoat layer, and a second microlens array. A key feature is that a second microlens has a larger radius of curvature than a first microlens. Additionally, each first microlens and second microlens is a flat convex lens. Thus, a thicker second microlens with a short focal length is aligned above a thinner first microlens having a long focal length. A light column that includes a first microlens, a second microlens and a color filter region is formed above each photodiode. A second embodiment involves replacing a second microlens in each light column with a plurality of smaller second microlenses that focus light onto a first microlens.

37 Claims, 4 Drawing Sheets

U.S. PATENT DOCUMENTS

| | | | |
|---|---|---|---|
| 6,727,487 B2 * | 4/2004 | Yamaguchi et al. | 250/208.1 |
| 6,784,014 B2 * | 8/2004 | Tanigawa | 438/60 |
| 6,819,360 B1 * | 11/2004 | Ide et al. | 348/340 |
| 6,821,810 B1 * | 11/2004 | Hsiao et al. | 438/69 |
| 6,903,395 B2 * | 6/2005 | Nakai et al. | 257/294 |
| 7,053,427 B2 * | 5/2006 | Tanigawa | 257/294 |
| 7,081,998 B2 * | 7/2006 | Shimizu et al. | 359/619 |
| 2001/0033007 A1 * | 10/2001 | Lee | 257/432 |

* cited by examiner

EFFECTIVE METHOD TO IMPROVE SUB-MICRON COLOR FILTER SENSITIVITY

FIELD OF THE INVENTION

The invention relates to a solid state imaging device (hereafter referred to as a CMOS image sensor) and a method of manufacturing the same. More particularly, the image sensor has an improved microlens component that increases the sensitivity of the device.

BACKGROUND OF THE INVENTION

A complementary metal oxide semiconductor (CMOS) image sensor is a key component of many digital video cameras. The CMOS image sensor is typically comprised of an upper stack that includes one or more layers of color filters, a microlens array, and an overcoat for the microlens and a lower stack that includes interlevel dielectric (ILD) layers, interlevel metal (ILM) layers, and passivation layers which are fabricated on a substrate. High sensitivity is an important characteristic for a CMOS image sensor since the image quality may suffer if sensitivity is not high enough. The function of the microlens component is to focus light through a color filter layer and the lower stack onto the sensing area or photodiode. Other layers in the light path must have a high transparency to that a minimal amount of light intensity is lost.

The elementary unit of the image sensor is a pixel which is an addressable area element with intensity and color attributes related in large part to the spectral signal contrast obtained from the photon collection efficiency of the microlens array, spectra transmission through the color filters, microlenses, and other layers in the imaging path, and the spectral response and efficiency of the photodiode. Constant advances in technology that have reduced the smallest dimension in the CMOS device to less than a micron have also forced the pixel size to shrink to less than 5 um. When a plurality of color regions are formed in a color filter layer, the width of a color region is called a pixel. Newer technologies require an increased number of ILM layers that lengthens the distance (focal length) between a microlens and a photodiode. The longer focal length is a big challenge to maintaining adequate sensor sensitivity. Although a thinner microlens is able to produce a longer focal length, the quantum efficiency of a thin microlens is lower than that of a thicker microlens because of less surface area. Therefore, an improved design is needed for the upper stack and especially for the microlens component in a CMOS image sensor that increases sensitivity and is compatible with a pixel size that is smaller than 5 um.

Figure 1:
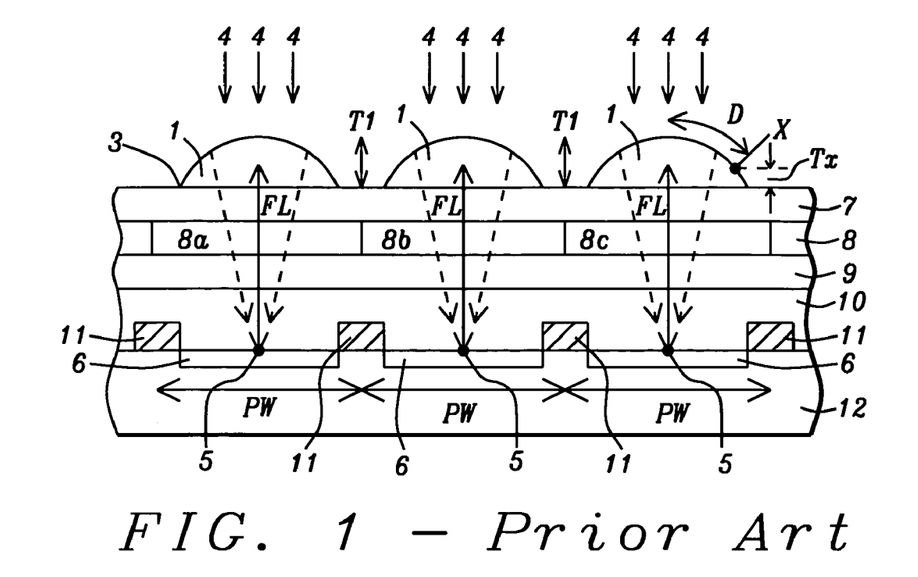
FIG. 1 depicts a prior art example of an image sensor in which a microlens array is formed above a color filter layer that is aligned above a photodiode.

A microlens is typically formed by patterning a photoresist that is preferably a positive tone type in which unexposed regions of the photoresist layer are chemically unaltered and remain on the substrate after an aqueous base developer is used to remove exposed regions. The resulting photoresist pattern is heated to a temperature that deforms a stripe or rectangular shape into a cylinder shape or a square shape into a hemisphere shape as shown in FIG. 1. The thermal treatment produces a microlens 1 with a flat bottom and top surface curvature such that the thickness $T_1$ hereafter referred to as the radius of curvature in the center of the microlens 1 is greater than the thickness $T_X$ at other points (X) on the microlens surface. The thickness $T_X$ becomes progressively smaller as the distance D from the center increases until reaching a minimum at the edges 3. This design enables light 4 from above the microlens to be focused to a point 5 on a photodiode 6 below the microlens. The distance between the microlens 1 and the focal point 5 is the focal length FL. In this design, a spacer layer 7, color filter layer 8, planarization layer 9, ILD layer 10, and ILM layer 11, and protective layer 12 are also depicted. Although color filter layer 8 is shown as a single layer with regions 8a, 8b, 8c alternating between green 8a and red 8b or blue 8c, the color filters may also be stacked such that each color filter is contained in a separate layer. Furthermore, the color filter layer 8 may be located above the microlens 1 array rather than below it. The pixel width (PW) is shown as the width of one color filter region 8a, 8b, or 8c.

U.S. Pat. No. 5,796,154 discloses a design including two layers of microlenses each having a thickness of about 2 microns that are separated by a transparent acrylate layer and preferably a color filter. The photorefractive index of the microlenses is higher than that of the acrylate and color filter. Since the lower microlens array does not reside on a planar surface, the size and oval shape of the microlens can be difficult to reproduce. In addition, the poly(vinylphenol)/diazonaphthoquinone diazide (DNQ) based photoresist that comprises the lower microlens has less suitable dissolution characteristics for patterning than a more common Novolak resin/DNQ photoresist.

A key feature in related U.S. Pat. Nos. 6,171,885 and 6,274,917 is microlens formation prior to color filter fabrication in order to minimize rework and place the microlens array in closer proximity to the photodiodes. A planarization layer is used to separate the microlens array from overlying color filter layers.

A high efficiency color filter process to improve color balance in an image sensor is described in U.S. Pat. No. 6,395,576. The color coating sequence involves coating a blue color filter layer first to form a color pixel structure with wider process window and improved adhesion to a substrate. The thickness of each color filter is adjusted in real time by a spectrophotometric algorithmic analyzer that drives a feedback servo control loop.

SUMMARY OF THE INVENTION

An objective of the present invention is to provide a microlens component in a CMOS image sensor that offers improved sensitivity in a device that has several metal (ILM) layers and requires a long focal length.

A further objective of the present invention is to provide a microlens component in a CMOS image sensor that offers improved sensitivity in a sub-micron device that has a pixel size smaller than about 5 microns.

A still further objective of the present invention is to provide a method of fabricating a CMOS image sensor having improved efficiency that is compatible with existing tools and materials and can be performed in a low cost manner.

These objectives are achieved by providing a lower stack of layers for a CMOS image sensor device. In one embodiment, a dielectric layer such as $SiO_2$ is formed on a substrate and a photodiode array is formed in the dielectric layer. Then a first metal layer (M1) is formed on the dielectric layer between photodiodes. A second ILD layer which is preferably an oxide is deposited on the M1 layer and substrate followed by a second metal layer (M2), a third ILD layer, a third metal layer (M3) and a fourth ILD layer. Next, a silicon oxynitride passivation layer is formed by conventional means on the uppermost ILD layer. The interconnect structure comprised of the ILD, ILM, and passivation stack also has contacts between the M1 layer and a conductive layer in the substrate, and has vias between M1 and M2 layers and between M2 and M3 layers.

An insulation layer is deposited on the passivation layer and is preferably a photoresist layer that provides high transmittance to light that passes through overlying color filters. A color filter layer that includes a plurality of green, red, and blue color regions is then formed above the insulation layer. The color filter layer is comprised of a crosslinked negative photoresist that has been dyed in specific regions to selectively transmit wavelengths in a blue, red, or green spectral range and forms the uppermost layer in the lower stack of layers.

Next, an upper stack of layers which is comprised of the microlens component of the CMOS image sensor is formed on the color filter layer. An optional spacer layer preferably comprised of the same material as in the insulation layer may be deposited on the color filter layer. A first microlens array with a plurality of first microlenses is then fabricated on the spacer layer by patterning a positive tone photoresist and heating to reflow and form flat convex shapes. There is one first microlens having a radius of curvature (H1) that is aligned above each color filter region and the width of a first microlens is less than or equal to a pixel width.

A planar overcoat layer which is preferably comprised of the same transparent material as in the insulation layer is formed on the first microlens array. A post-exposure bake at 220° C. not only hardens the overcoat layer but also hardens the first microlens array. A second microlens array comprised of a plurality of second microlenses is fabricated on the overcoat layer by first patterning a positive tone photoresist, heating to reflow, and hardening with a 220° C. bake to form flat, convex shapes. A second microlens has a width that is essentially equal to the width of a first microlens. Moreover, there is a second microlens aligned over each first microlens. A second microlens preferably has a radius of curvature (H2) that is greater than H1. The larger radius of curvature provides for a shorter focal length and higher photon collection efficiency for a second microlens compared to a first microlens. Light that is efficiently collected by a second microlens is focused on a first microlens. The first microlens has a long focal length that is capable of focusing light through a light column within a thick lower stack of layers onto a photodiode.

The invention is also a microlens component of a CMOS image sensor with improved sensitivity that is formed on a lower stack of layers that includes a photodiode array on a substrate and a color filter layer as the top layer in the lower stack. The lower stack typically includes a interconnect structure on the substrate and an insulation layer formed on the insulation layer. The microlens component is comprised of a first microlens array formed above the color filter layer, a planar transparent overcoat layer on the first microlens array, and a second microlens array formed on the overcoat layer. Each of the plurality of microlenses in the first microlens array and in the second microlens array has a flat convex shape. An important feature is that the radius of curvature of a second microlens is greater that the radius of curvature of a first microlens. A light column is formed which involves a vertical arrangement of a photodiode, a color filter region, a first microlens, and a second microlens. Other intermediate layers described previously have a high transmittance to minimize loss of light intensity as light passes through the light column. Photon collection efficiency ($\psi$) of a microlens is expressed by the equation $\psi = 4 PI \times R^2$ where PI is the photorefractive index of a microlens and R is the radius of curvature.

In a second embodiment, the second microlens array of the microlens component in an image sensor is comprised of a plurality of subunits which are each comprised of a plurality of second microlenses. The collective width of the plurality of second microlenses in a subunit is equal to the width of a first microlens. A subunit of second microlens is aligned over a first microlens so that a vertical light column is formed that includes a photodiode, a color filter region, a first microlens, and a second microlens. The radius of curvature of a second microlens is preferably greater than the radius of curvature of a first microlens. It is important that there is no gap between adjacent second microlenses in a subunit.

DETAILED DESCRIPTION OF THE INVENTION

The present invention is a microlens component of a CMOS image sensor that provides improved sensitivity for sub-micron devices that have a pixel size of less than 5 microns. A process is also described for forming the improved CMOS image sensor. The drawings are provided by way of example and are not intended to limit the scope of the invention. Furthermore, the relative sizes of the various elements within the drawings are not necessarily drawn to size.

Figure 2A:
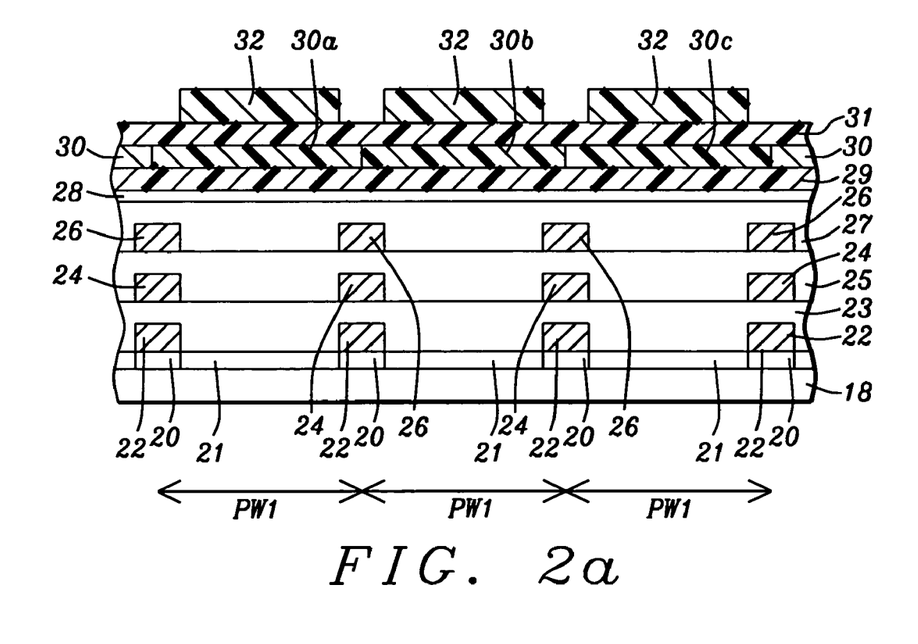
FIGS. 2a-2c are cross-sectional views of a method of forming a microlens component of an image sensor in which a second microlens is aligned over a first microlens, a color filter region, and a photodiode according to the first embodiment of the present invention.

Referring to FIG. 2a, a substrate 18 is provided that may contain active and passive devices that are not shown in order to simplify the drawing. A lower stack of layers for a CMOS image sensor will now be described. A first dielectric layer 20 such as $SiO_2$ is deposited on the substrate 18 and a photodiode array comprised of photodiodes 21 is fabricated within the first dielectric layer by conventional means. An interconnect structure comprised of a first metal (ILM) layer 22 is formed on dielectric layer 20 but not over photodiodes 21. The interconnect structure may be further comprised of a second dielectric (ILD) layer 23, a second ILM layer 24, a third ILD layer 25, a third metal layer 26, and a fourth ILD layer 27 that are successively formed above the first ILM layer 22. Although 3 ILM and 4 dielectric layers are depicted, the invention is equally effective for a plurality of ILM and ILD layers. The ILD layers 23, 25, 27 are typically silicon oxide but may be a low k dielectric material such as fluorine doped $SiO_2$ or carbon doped $SiO_2$ and are otherwise known as insulation layers. ILM layers 22, 24, 26 are preferably copper, aluminum or an Al/Cu alloy.

The ILD layers and ILM layers are formed by methods known to those skilled in the art and are not described herein. Note that the ILM layers 22, 24, 26 are aligned in vertical arrays. The ILM layers 23, 25, 27 are highly transparent to light used in the image sensor and form the bottom portion of a light column between adjacent vertical arrays of ILM layers. Typically, there are also vias (not shown) that connect one ILM layer with an overlying ILM layer and contacts (not shown) that connect a first ILM layer 22 with an active area in the substrate.

The lower stack of layers generally includes one or more passivation layers. In one embodiment, a passivation layer 28 which is preferably silicon oxynitride is deposited by a chemical vapor deposition (CVD) or plasma enhanced CVD (PECVD) method on the fourth ILD layer 27.

A planarization layer 29 may be formed on the passivation layer 28 and is preferably a negative tone photoresist with high (>99%) transparency to light in the visible wavelength range of about 340 to 650 nm which is transmitted within a light column. The photoresist is coated, baked, and then exposed with one or more wavelengths in a range of about 240 to 450 nm. A post-expose bake may be employed to promote a crosslinking reaction initiated by the exposure. As a result, the crosslinked photoresist that is planarization layer 29 does not mix with an overlying layer which is formed in a subsequent step. The planarization layer 29 has a thickness between about 4000 and 18000 Angstroms.

A color filter layer 30 is fabricated on planarization layer by a conventional method and is comprised of color filter regions 30a, 30b, 30c that are each dyed to provide a color filter that selectively transmits wavelengths in a certain spectral range. In the exemplary embodiment, region 30a is a green filter, region 30b is a red filter, and region 30c is a blue filter. The order of green, red, blue is not critical but it is important for each color of green, red, and blue to be represented in three adjacent color regions. The width of each color filter region is shown as a pixel width PW1. This invention is especially applicable for a PW1 that is less than about 5 microns. The color filter layer 30 is preferably a crosslinked negative tone photoresist that does not mix with overlying or underlying layers. The color filter layer 30 has a thickness in the range of about 0.5 to 1.8 microns and forms the uppermost layer in the lower stack of layers.

A key feature of the present invention is the formation of an upper stack of layers that is comprised of the microlens component of the image sensor. In one embodiment, a transparent spacer layer 31 is formed on the color filter layer 30 by preferably employing the same process and photoresist composition that is used to form the planarization layer 29. The spacer layer 31 preferably has a planar surface and is from about 1.7 to 2 microns thick. A planar spacer layer 31 enables a wide process latitude in a subsequent photoresist patterning step.

A first microlens array is fabricated by initially patterning a photoresist layer 32 on the spacer layer 31 by a conventional method. The photoresist layer 32 preferably has a positive tone composition that is comprised of a Novolak resin and a DNQ photosensitive compound. Exposed portions (not shown) are removed in an aqueous base developer while unexposed portions of the photoresist layer 32 remain on the spacer layer 31. Note that each unexposed portion of the photoresist layer 32 is aligned above a color filter region 30a, 30b, or 30c.

Figure 2B:
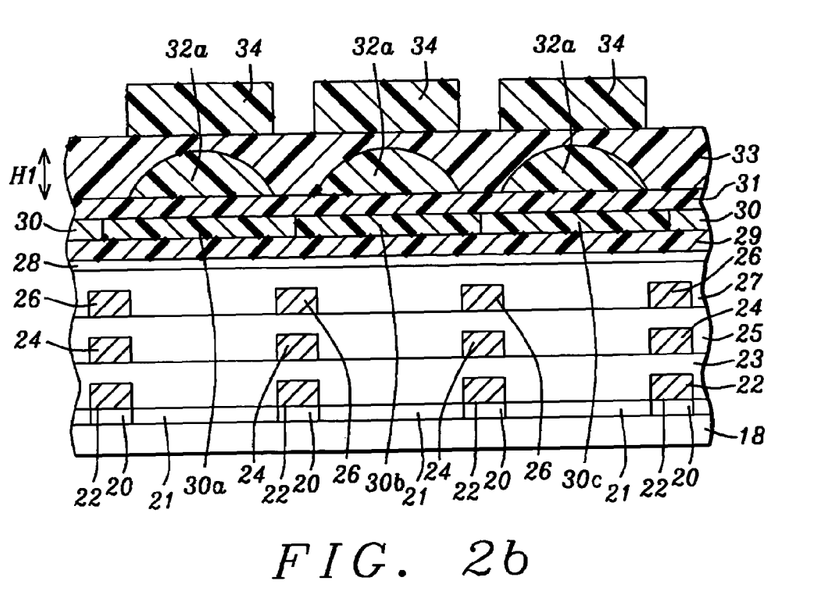

Referring to FIG. 2b, the photoresist layer 32 is heated to approximately 160° C. for about 10 minutes which causes the photoresist layer to reflow. Surface tension produces a first microlens array comprised of a plurality of first microlenses 32a that have a flat convex shape after cooling. In other words, a first microlens has a flat bottom on the spacer layer 31 while the top and sides form a curved surface with a convex shape that has a radius of curvature H1. The width of a first microlens 32a is about the same as the width of the original unexposed portion of the photoresist layer 32. The radius of curvature H1 for a first microlenses 32a is from about 0.5 to 1.4 microns while the width of a first microlens is less than or equal to a pixel width.

At this point, an overcoat layer 33 that is preferably comprised of the same highly transparent material as in the planarization layer 29 and spacer layer 31 is formed by coating and baking a photoresist in a range of about 90° C. to 150° C. The overcoat layer 33, spacer layer 31, and planarization layer 29 preferably have a photorefractive index (PI) in the range of about 1.4 to 1.7. The overcoat layer 33 which has a thickness from about 1.5 to 2.5 microns is exposed and then post-expose baked at about 220° C. for 1000 to 1200 seconds to crosslink the overcoat layer 33 and harden the first microlenses 32a. The post-expose bake also serves to form a more planar overcoat layer 33 which is necessary for a wide process window in a subsequent patterning step.

A second microlens array is formed on the overcoat layer 33 by patterning a photoresist layer 34 that is preferably comprised of the same photoresist composition used in the photoresist layer 32. However, other photoresist compositions that include a Novolak resin and a DNQ sensitive compound are acceptable. Note that each unexposed portion of the photoresist layer 34 is aligned over a first microlens 32a and that the openings between the unexposed portions are above vertical arrays of the ILM layers 22, 24, 26. Moreover, the width of an unexposed portion of the photoresist layer 34 is essentially equal to the width of a first microlens 32a.

Figure 2C:
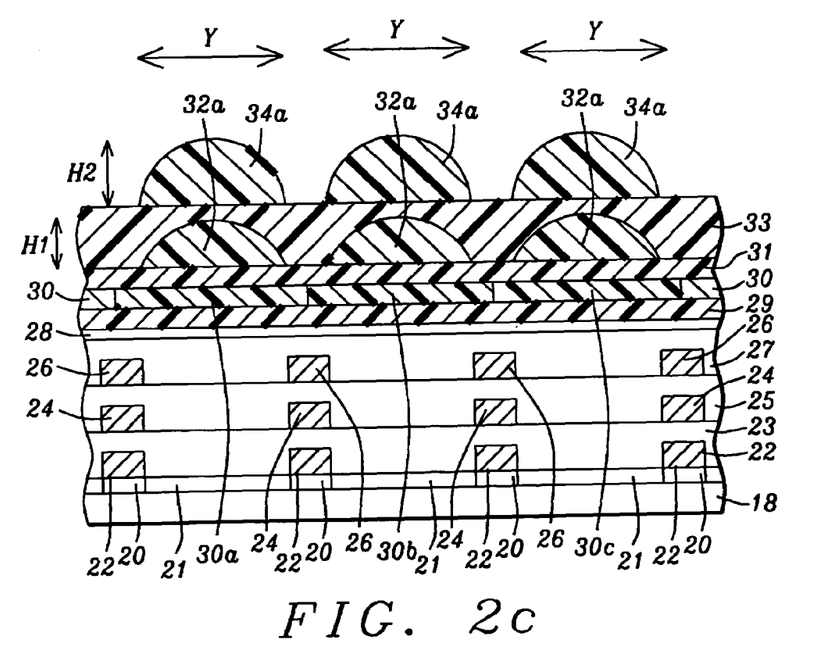

Referring to FIG. 2c, the photoresist layer 34 is reflowed by heating the substrate 18 to approximately 160° C. for about 10 minutes and is then hardened by an additional bake at 220° C. to generate a second microlens array comprised of second microlenses 34a that have a flat convex shape. A second microlens 34a is formed with a flat bottom on the overcoat layer 33 while the top and sides form a curved surface with a convex shape and a radius of curvature H2 between about 0.5 an 1.4 microns. The width Y of a second microlens 34a is preferably the same as the width of a first microlens 32a. As a result, a light column is formed in the upper stack of layers and is comprised of a second microlens 34a, an underlying first microlens 32a, a portion of the overcoat layer 33 between a first microlens 32a and a second microlens 34a, and a portion of the spacer layer 31 between a first microlens and an underlying color filter region 30a, 30b, or 30c. It is understood that a light column in the upper stack of layers is aligned over a light column in the lower stack of layers to form a continuous vertical light column. A vertical light column is defined as a light column that is oriented in a direction which is perpendicular to the surface of the substrate 18 on which a photodiode 21 is formed.

The inventors have found that a key requirement for the microlens component of the present invention is that H2 must be greater than H1. When H2>H1, a second microlens has a greater photon collection efficiency than a first microlens. Photon collection efficiency ($\psi$) of a microlens in the first or second microlens array is expressed by the equation $\psi = 4 PI \times R^2$ where PI is the photorefractive index of a microlens and R is the radius of curvature. Preferably, the PI is form about 1.4 to 1.7 for a first microlens 32a or second microlens 34a. More preferably, the PI of a first microlens 32a and a second microlens 34a is essentially the same as the PI of the planarization layer 29, spacer layer 31, and the overcoat layer 33 to minimize the amount of light that is scattered as light is transmitted through a light column.

Those skilled in the art will appreciate that when H2>H1, a first microlens will have a longer focal length than a second microlens. This relationship provides an advantage for the microlens component of the image sensor in the present invention because light captured by the high ψ of a second microlens is efficiently focused onto a first microlens which in turn focuses the light through a thick lower stack of layers. In other words, a second microlens having a high ψ would not have a large enough focal length to be able to focus light efficiently through a thick lower stack of layers to a photodiode with a pixel size of less than about 5 microns. On the other hand, a first microlens with a long focal length does not have a high enough ψ by itself to provide a high sensitivity signal. Only a combination of a first microlens array and a second microlens array as described in the first embodiment provides a high sensitivity in addition to a long focal length for small pixel sizes of less than about 5 microns. This arrangement is more efficient than a dual microlens array described in prior art where a microlens in a first array has the same R as a microlens in a second array.

The present invention is compatible with newer technologies that have a thick lower stack comprised of a plurality of ILM and ILD layers where a long focal length in the image sensor device is required. The method of the first embodiment is cost efficient since the planarization layer, spacer layer, and overcoat layer may have the same composition and are processed in existing tools. Additionally, the first microlens array and the second microlens array have the same positive tone photoresist composition which reduces the number of materials needed in a manufacturing line. Each layer in the microlens component is processed so that crosslinking or hardening by a heat treatment prevents intermixing with adjacent layers that could degrade device performance.

Figure 2D:
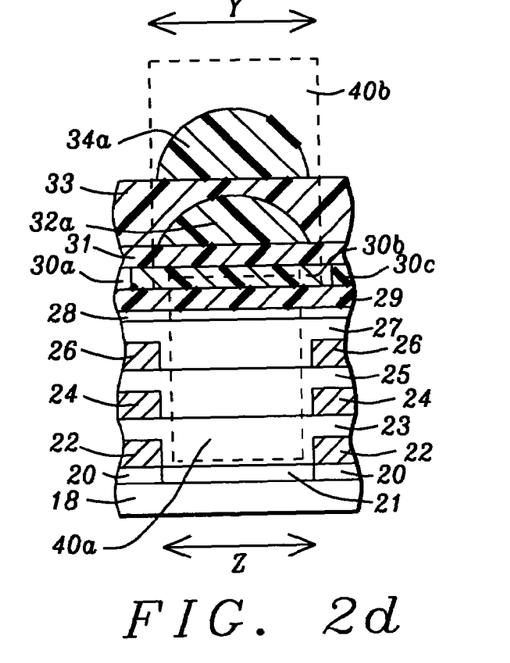
FIG. 2d depicts a light column in an image sensor structure and FIG. 2e shows the light path through the light column according to the present invention.
Figure 2E:
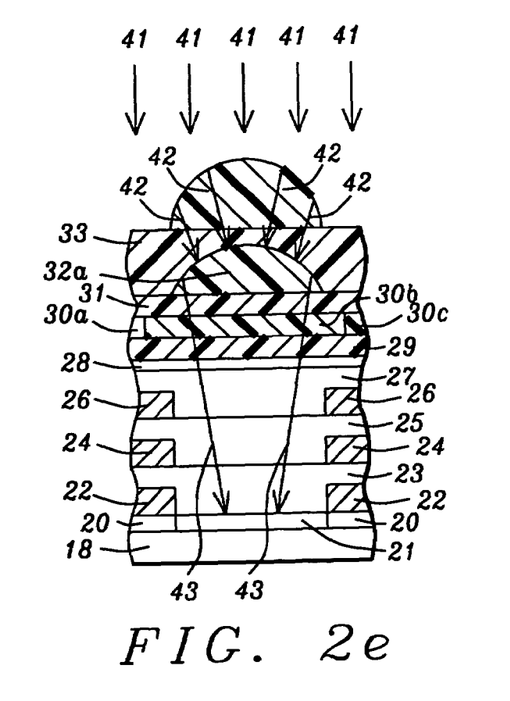

The present invention is also a microlens component within an upper stack of layers in a CMOS image sensor as depicted in FIGS. 2c-2e. The upper stack is formed on a lower stack of layers on a substrate. In one embodiment, the lower stack is comprised of an interconnect structure that includes ILM layers 22, 24, 26 and ILD layers 23, 25, 27 formed above a plurality of photodiodes 21 in a photodiode array on a substrate 18. There is a passivation layer 28 on ILD layer 27 and a planarization layer 29 formed on passivation layer 28. The top layer in the lower stack is a color filter layer 30 which has a plurality of color filter regions including color filter regions 30a, 30b, 30c formed on the planarization layer 29.

The upper stack is comprised of a spacer layer 31 formed on a color filter layer 30, a first microlens array having a plurality of first microlenses 32a on the spacer layer, an overcoat layer 33 on the first microlens array, and a second microlens array having a plurality of second microlenses 34a formed on the overcoat layer.

Referring to FIG. 2d, an enlarged view of a middle vertical section of the image sensor in FIG. 2c is shown. In the exemplary embodiment, a light column that includes the color filter region 30b is depicted and has a lower portion 40a and an upper portion 40b formed above a photodiode 21. The lower portion 40a is formed in the lower stack of layers and is comprised of portions of the ILD layers 23, 25, 27 as well as portions of the planarization layer 29 and passivation layer 28. The upper portion 40b includes a first microlens 32a, a second microlens 34a, and portions of the overcoat layer 33 and spacer layer 31. The width Y of the upper portion 40b is larger than or equal to the width Z of the lower portion 40a.

Referring to FIG. 2e, incident light 41 on a second microlens 34a is focused as a beam 42 onto an underlying first microlens 32a which in turn focuses a beam 43 through a spacer layer 31 and the lower stack of layers onto a photodiode 21.

Returning to FIG. 2c, an important feature of the microlens component of the image sensor is that the radius of curvature H2 of a second microlens is greater than the radius of curvature H1 of a first microlens. This relationship enables a second microlens with a high ψ to focus light on an underlying first microlens that has a long focal length and is capable of focusing light through a thick lower stack of layers onto a photodiode. As mentioned previously, this microlens design is more efficient that other dual lens structures in prior art.

In a second embodiment, the process of the first embodiment is followed through the formation of the overcoat layer 33. A second microlens array having a plurality of subunits which are each comprised of a plurality of second microlenses is then formed above the overcoat layer 33 as illustrated in FIGS. 3a-3b.

Figure 3A:
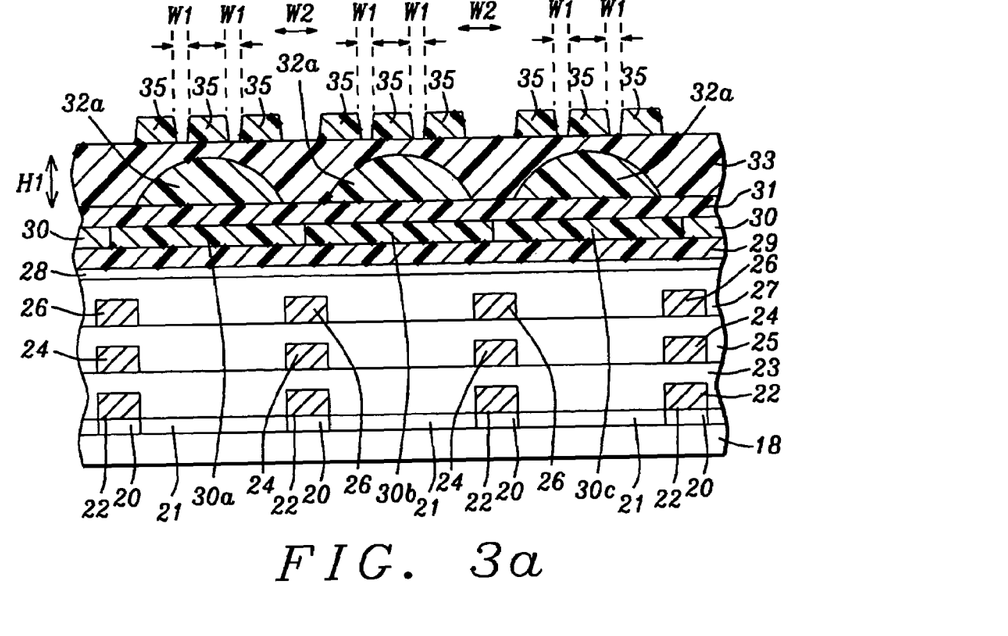
FIGS. 3a-3b are cross-sectional views that illustrate a method of forming a microlens component in an image sensor in which a second microlens array comprised of a plurality of subunits of second microlenses is aligned over a first microlens, a color filter region, and a photodiode according to a second embodiment.

Referring to FIG. 3a, a positive tone photoresist which preferably has the same composition as the photoresist used to form the first microlens array is patterned on the overcoat layer 33 to form a photoresist layer 35 that has openings which may not necessarily have vertical sidewalls. The width W1 of the openings in a portion of the photoresist layer 35 formed over a first microlens 32a is smaller than the openings W2 which corresponds to the distance between adjacent first microlenses 32a. A portion of the photoresist layer 35 between adjacent openings having a width W2 will subsequently become a subunit of second microlenses. In the exemplary embodiment, the number of second microlenses formed in each subunit is three. However, the invention is also effective with a plurality of "n" second microlenses in each subunit. Note that each subunit of second microlenses is aligned above a first microlens 32a.

Figure 3B:
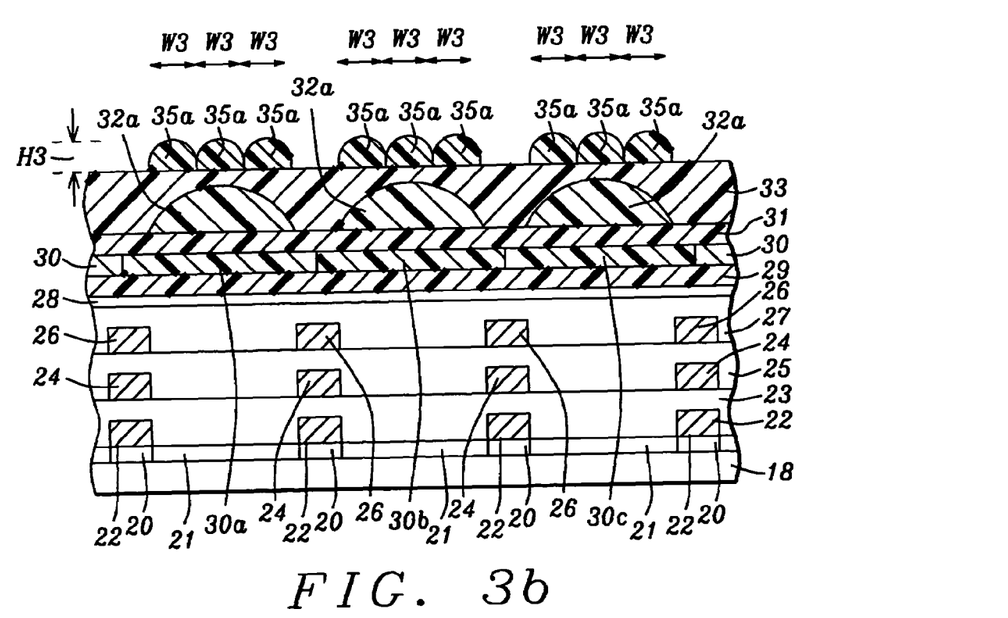

Referring to FIG. 3b, the structure in FIG. 3a is heated to approximately 160° C. for about 10 minutes to reflow photoresist layer 35 which is then hardened by another bake at 220° C. to form second microlenses 35a that have a width W3 and a radius of curvature between about 0.5 and 1.2 microns. A second microlens 35a has a flat convex shape with a flat bottom formed on the overcoat layer 33 and top and sides that form a curved surface with a convex shape. It is important that there is no space W1 remaining between second microlenses 35a. When there are "n" second microlenses 35a in a subunit, then the collective width of n×W3 is equivalent to the width of an underlying first microlens 32a. As a result, a light column is formed in the upper stack of layers and is comprised of a plurality of second microlenses 35a in a subunit in the second microlens array, an underlying first microlens 32a, a portion of the overcoat layer 33 between a first microlens 32a and a plurality of overlying second microlenses 35a, and a portion of the spacer layer between a first microlens and an underlying color filter region 30a, 30b, or 30c. It is understood that the light column in the upper stack of layers is aligned above a light column in a lower stack of layers as described previously.

The ψ value of a subunit of second microlenses 35a is expressed by the equation $\psi = 4PI \times N^2 \times (R/N)^2$ where PI is the photorefractive index of a second microlens, R is the radius of curvature of a second microlens, and N is the number of second microlenses. Preferably, PI is from about 1.4 to 1.7 for a first microlens 32a and for a second microlens 35a. More preferably, the PI of a first microlens 32a and a second microlens 35a is essentially the same as the PI of the planarization layer 29, spacer layer 31, and overcoat layer 33 to minimize the amount of light that is scattered as light is transmitted through a light column.

The $\psi$ value of a subunit of second microlenses 35a may be equal to or slightly less than the $\psi$ value of a second microlens 34a described in the first embodiment. However, the efficiency of the microlens component of the second embodiment is still higher than for a dual microlens structure described in prior art in which a first microlens and an overlying second microlens have the same radius of curvature. This result is achieved because the radius of curvature H3 of a second microlens 35a is greater than the radius of curvature H1 of a first microlens 32a. Therefore, a subunit of second microlenses 35a with a relatively short focal length is able to efficiently capture light which is then focused onto a first microlens 32a. The first microlens 32a has a long focal length that is capable for focusing light through a thick lower stack of layers onto a photodiode 21. The microlens design of the second embodiment is especially effective for an image sensor that has a pixel size of less than about 5 microns.

The present invention is compatible with newer technologies that have a thick lower stack comprised of a plurality of ILM and ILD layers because of the long focal length of a first microlens. The method is cost effective since the planarization layer, spacer layer, and overcoat layer have the same composition and are processed in existing tools. Additionally, the first microlens array and the second microlens array may have the same positive tone photoresist composition which reduces the number of materials needed in a manufacturing line. Each layer in the microlens component of the image sensor is processed so that crosslinking or hardening by a heat treatment prevents intermixing with adjacent layers which could degrade the final device performance.

The present invention is also a microlens component within an upper stack of layers in a CMOS image sensor as depicted in FIG. 3b. The upper stack is formed on a lower stack of layers on a substrate. In one embodiment, the lower stack is comprised of an interconnect structure that includes ILM layers 22, 24, 26 and ILD layers 23, 25, 27 formed above a plurality of photodiodes 21 in a photodiode array on a substrate 18. There is a passivation layer 28 on ILD layer 27 and a planarization layer 29 formed on passivation layer 28. The top layer in the lower stack is a color filter layer 30 which has a plurality of color filter regions including color filter regions 30a, 30b, 30c formed on the planarization layer 29.

The upper stack is comprised of a spacer layer 31 formed on a color filter layer 30, a first microlens array having a plurality of first microlenses 32a on the spacer layer, an overcoat layer 33 on the first microlens array, and a second microlens array having a plurality of subunits each having a plurality of second microlenses 35a formed on the overcoat layer.

In the exemplary embodiment in FIG. 3b, a second microlens array is comprised of a plurality of subunits each having a plurality of second microlenses. Each subunit is aligned over a first microlens. It is understood that a top portion of a light column formed by a subunit of second microlenses, an underlying first microlens, a portion of the overcoat layer between the subunit in the second microlens array and a first microlens, and a portion of the spacer layer between the overlying first microlens and underlying color filter region is aligned above a bottom portion of a light column in the lower stack. Furthermore, a first microlens 32a and a second microlens 35a have a flat convex shape. The collective width of "n" second microlenses 35a in a subunit is essentially equal to the width of a first microlens 32a. For example, in FIG. 3b, 3×W3 is equal to the width of a first microlens.

An important feature of a second microlens 35a is that its radius of curvature H3 is larger than the radius of curvature H1 of a first microlens 32a. This relationship enables a subunit of second microlenses 35a to have a high photon collection efficiency similar to a second microlens 34a in the first embodiment. A subunit focuses light onto a first microlens 32a that has a long focal length and is able to focus light through a thick lower stack of layers. The microlens component design of the second embodiment is especially effective for image sensors having a pixel size of less than about 5 microns. The advantage of the second embodiment is that a microlens component comprised of a second microlens array with a subunit having a high $\psi$ value and short focal length and a first microlens array having a first microlens with a long focal length provides a higher sensitivity in a image sensor device than previously achieved.

While this invention has been particularly shown and described with reference to, the preferred embodiment thereof, it will be understood by those skilled in the art that various changes in form and details may be made without departing from the spirit and scope of this invention.

We claim:

1. A microlens component of an image sensor formed above a color filter layer having of an array of color regions on a substrate, comprising:
   (a) a first microlens array formed above the color filter layer, said first microlens array having a plurality of first microlenses wherein each first microlens has a radius of curvature;
   (b) a planar transparent overcoat layer formed on said first microlens array; and
   (c) a second microlens array formed on said overcoat layer, said second microlens array having a plurality of second microlenses wherein each second microlens has a radius of curvature;
   wherein the radius of curvature of each of the second microlenses is larger than the radius of curvature of each of the first microlenses; and
   wherein more than one of said plurality of second microlenses overlies each of said first microlenses.

2. The image sensor of claim 1 wherein a first microlens is a flat convex lens.

3. The image sensor of claim 1 wherein a second microlens is a flat convex lens.

4. The image sensor of claim 1 wherein each of the plurality of second microlenses is positioned over an associated one of the plurality of first microlenses.

5. The image sensor of claim 1 wherein the overcoat layer is comprised of a negative tone photoresist that has >99% transparency to light used in the image sensor.

6. An image sensor, comprising:
   (a) a substrate having a plurality of photodiodes formed thereon;
   (b) a stack of transparent insulation layers disposed above each photodiode;
   (c) a color filter layer comprised of an array of color filter regions formed above said stack of transparent insulation layers;

(d) a first microlens array formed above the color filter layer, said first microlens array having a plurality of first microlenses wherein each first microlens has a radius of curvature;

(e) a planar transparent overcoat layer formed on said first microlens array; and (f) a second microlens array formed on said overcoat layer, said second microlens array having a plurality of second microlenses wherein each second microlens has a radius of curvature and is aligned over a first microlens;

wherein the radius of curvature of each of the second microlenses is greater than the radius of curvature of the associated underlying first microlens; and wherein more than one of said plurality of second microlenses overlies each of said first microlenses.

7. The image sensor of claim 6 wherein a vertical arrangement of more than one of said second microlenses, one of said first microlenses, and a color filter region causes light impinging on the surface of a second microlens to be focused with high efficiency through a first microlens and color filter region onto a photodiode.

8. The image sensor of claim 6 wherein a first microlens is a flat convex lens.

9. The image sensor of claim 8 wherein a first microlens has a radius of curvature between about 0.5 and 1.4 microns.

10. The image sensor of claim 6 wherein at least one of said plurality of second microlenses is a flat convex lens.

11. The image sensor of claim 6 wherein the second microlens array is comprised of a plurality of subunits each having a plurality of second microlenses that focus light onto a single first microlens.

12. The image sensor of claim 11 wherein the second microlenses in a subunit have a collective width that is equal to the width of a first microlens.

13. The image sensor of claim 6 wherein the overcoat layer and insulation layer are comprised of a negative tone photoresist that has >99% transparency to light.

14. An image sensor device, comprising:

(a) a substrate having a plurality of photodiodes formed thereon;

(b) an interconnect structure comprised of a stack of metal layers and insulation layers formed on said substrate;

(c) a stack of insulation layers above each photodiode and between said metal layers in the interconnect structure;

(d) a color filter layer comprised of an array of color filter regions formed above said interconnect structure;

(e) a first microlens array formed above the color filter layer, said first microlens array having a plurality of first microlenses wherein each first microlens has a radius of curvature;

(f) a planar transparent overcoat layer formed on said first microlens array; and (g) a second microlens array formed on said overcoat layer, said second microlens array having a plurality of second microlenses wherein each second microlens has a radius of curvature and is aligned above a first microlens;

wherein the radius of curvature of each of the second microlenses is greater than the radius of curvature of the associated underlying first microlens; and wherein more than one of said plurality of second microlenses overlies each of said first microlenses.

15. The image sensor device of claim 14 wherein a vertical arrangement of one of said second microlenses, more than one of said first microlenses, and a color filter region causes light impinging on the surface of a second microlens to be focused with high efficiency through a first microlens and color filter region onto a photodiode.

16. The image sensor device of claim 14 further comprised of a transparent spacer layer formed between the color filter layer and the first microlens array.

17. The image sensor device of claim 14 wherein the insulation layer, spacer layer, and overcoat layer are comprised of a negative tone photoresist that has >99% transparency to light.

18. The image sensor device of claim 14 wherein a first microlens is a flat convex lens.

19. The image sensor device of claim 18 wherein the first microlens has a radius of curvature between about 0.5 and 1.4 microns.

20. The image sensor device of claim 14 wherein a second microlens is a flat convex lens.

21. The image sensor device of claim 14 wherein the second microlens array is comprised of a plurality of subunits each having a plurality of second microlenses that focus light onto a first microlens.

22. The image sensor device of claim 21 wherein the second microlenses in a subunit have a collective width that is equal to the width of a first microlens.

23. The image sensor device of claim 21 wherein each subunit comprises three microlenses.

24. A method of forming an image sensor on a substrate comprising:

(a) providing a semiconductor substrate having a plurality of photodiodes formed therein;

(b) forming a color filter layer comprised of an array of color filter regions on said substrate;

(c) forming a first microlens array that includes a plurality of first microlenses having a radius of curvature above said color filter layer;

(d) forming a planar transparent overcoat layer on said first microlens array; and (e) forming a second microlens array that includes a plurality of second microlenses having a radius of curvature on said overcoat layer;

wherein the radius of curvature of each of the second microlenses is greater than the radius of curvature of each of the first microlenses; and wherein more than one of said plurality of second microlenses overlies each of said first microlenses.

25. The method of claim 24 wherein the color filter layer is comprised of a negative tone photoresist that is crosslinked and has a thickness of about 0.5 to 1.8 microns.

26. The method of claim 24 wherein a vertical arrangement of more than one of said second microlenses, one of said first microlenses, and a color filter region are aligned above a photodiode.

27. The method of claim 24 wherein the overcoat layer has a thickness between about 1.5 and 2.5 Angstroms.

28. The method of claim 24 wherein at least one of said plurality of first microlenses is a flat convex lens.

29. The method of claim 24 wherein at least one of said plurality of second microlenses is a flat convex lens.

30. The method of claim 24 wherein at least one of said plurality of first microlenses has a radius of curvature in the range of about 0.5 to 1.4 microns.

31. The method of claim 24 wherein forming a first microlens comprises reflowing a positive tone photoresist pattern comprised of a Novolak resin and a DNQ photosensitive compound at about 160° C. for about 10 minutes.

32. The method of claim 31 wherein forming the transparent overcoat layer comprises a 220° C. bake that hardens the first microlens array.

33. The method of claim 24 wherein forming a second microlens comprises reflowing a positive tone photoresist pattern comprised of a Novolak resin and a DNQ photosensitive compound at about 160° C. for about 10 minutes and then hardening at 220° C.

34. The method of claim 24 wherein the second microlens array is comprised of a plurality of subunits each having a plurality of second microlenses that focus light onto a first microlens.

35. The method of claim 34 wherein the second microlenses in a subunit have a collective width that is equal to the width of a first microlens.

36. The method of claim 24 further comprised of forming a transparent spacer layer between the color filter layer and first microlens array.

37. The method of claim 24 wherein the substrate is further comprised of an interconnect structure that includes a stack of transparent insulation layers formed above the plurality of photodiodes, said color filter layer is formed above said interconnect structure.

* * * * *

UNITED STATES PATENT AND TRADEMARK OFFICE
CERTIFICATE OF CORRECTION

PATENT NO. : 7,372,497 B2  Page 1 of 1
APPLICATION NO. : 10/833565
DATED : May 13, 2008
INVENTOR(S) : Fu-Tien Weng et al.

It is certified that error appears in the above-identified patent and that said Letters Patent is hereby corrected as shown below:

Title Page;

add to (75) Inventors: -- Chung-Sheng Hsiung
                          Po-Wen Lin --.

Column 12, line 46-47, delete "crossliniked" and insert -- crosslinked -- therefor.

Signed and Sealed this

Twenty-second Day of July, 2008

JON W. DUDAS
*Director of the United States Patent and Trademark Office*